(12) United States Patent
Oh et al.

(10) Patent No.:     US 12,681,081 B2
(45) Date of Patent:         Jul. 14, 2026

(54) JITTER MEASURING CIRCUIT, JITTER ANALYZING APPARATUS INCLUDING THE SAME, AND RELATED METHODS OF MANUFACTURING SEMICONDUCTOR DEVICES

(71) Applicant: Samsung Electronics Co., Ltd., Suwon-si (KR)

(72) Inventors: Hyeon Gwan Oh, Suwon-si (KR); Beomsang Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 18/203,024

(22) Filed: May 29, 2023

(65) Prior Publication Data

US 2024/0201254 A1     Jun. 20, 2024

(30) Foreign Application Priority Data

Dec. 19, 2022     (KR) ........................ 10-2022-0178427

(51) Int. Cl.
| | |
|---|---|
| *G01R 31/317* | (2006.01) |
| *G01R 29/26* | (2006.01) |
| *H10P 72/00* | (2026.01) |
| *H10P 74/00* | (2026.01) |

(52) U.S. Cl.
CPC ....... *G01R 31/31709* (2013.01); *G01R 29/26* (2013.01); *H10P 72/0604* (2026.01); *H10P 74/23* (2026.01)

(58) Field of Classification Search
CPC .............. G01R 31/31709; G01R 29/26; G01R 31/2881; G01R 31/2882; G01R 31/31713; G01R 31/31725; G01R 31/31727; G01R 31/3177; H01L 21/67253; H01L 22/20; H03K 5/13; H03K 2005/00234
USPC .................................. 324/762.01, 537, 500
See application file for complete search history.

(56) References Cited

U.S. PATENT DOCUMENTS

| | | | |
|---|---|---|---|
| 6,219,305 | B1 | 4/2001 | Patrie et al. |
| 6,807,509 | B2 | 10/2004 | Bourdin et al. |
| 6,931,349 | B2 | 8/2005 | Jang |
| 7,308,372 | B2 | 12/2007 | Rifani et al. |
| 7,809,517 | B1 | 10/2010 | Zuckerman |
| 7,816,960 | B2 | 10/2010 | Saint-Laurent et al. |
| 8,144,756 | B2 | 3/2012 | Lee et al. |

(Continued)

FOREIGN PATENT DOCUMENTS

| | | |
|---|---|---|
| JP | 2006329987 A | 12/2006 |
| JP | 2007037097 A | 2/2007 |

(Continued)

OTHER PUBLICATIONS

J. A. Mcneill, "Jitter in ring oscillators," in IEEE Journal of Solid-State Circuits, Jun. 1997, pp. 870-879, vol. 32, No. 6.

*Primary Examiner* — Giovanni Astacio-Oquendo
(74) *Attorney, Agent, or Firm* — Muir Patent Law, PLLC

(57)     ABSTRACT

A jitter analyzing apparatus may include a first delay circuit configured to delay a reference clock to output a first clock, a second delay circuit configured to delay the reference clock to output a second clock having a delay value greater than the first delay circuit, and a test device configured to measure a jitter component of the first and second delay circuits by measuring the first clock and the second clock.

20 Claims, 15 Drawing Sheets

10

110

(56)  References Cited

U.S. PATENT DOCUMENTS

| | | | |
|---|---|---|---|
| 8,390,268 B2 | 3/2013 | Okayasu | |
| 10,009,017 B2 | 6/2018 | Chou et al. | |
| 10,613,141 B2 | 4/2020 | Choo et al. | |
| 10,845,404 B2 | 11/2020 | Huang | |
| 10,890,610 B2 * | 1/2021 | Gondi | G01R 31/3171 |
| 12,174,251 B2 * | 12/2024 | Kusko | G01R 31/3183 |
| 2008/0065934 A1 * | 3/2008 | Whetsel | G01R 31/31722 |
| | | | 714/701 |
| 2018/0026737 A1 * | 1/2018 | Kucheravy | H04L 1/248 |
| | | | 375/227 |
| 2020/0166572 A1 * | 5/2020 | Whetsel | G01R 31/318508 |
| 2020/0174053 A1 | 6/2020 | Gondi et al. | |
| 2023/0094107 A1 | 3/2023 | Kusko et al. | |
| 2024/0255572 A1 * | 8/2024 | Chughtai | G01R 13/02 |

FOREIGN PATENT DOCUMENTS

| | | | |
|---|---|---|---|
| JP | 2007271473 A | 10/2007 | |
| JP | 2018189410 A | 11/2018 | |
| KR | 1020100079082 A | 7/2010 | |
| KR | 1020100104245 A | 9/2010 | |
| KR | 1020100111988 A | 10/2010 | |
| KR | 101538457 B1 | 7/2015 | |
| KR | 1020190015062 A | 2/2019 | |

* cited by examiner

JITTER MEASURING CIRCUIT, JITTER ANALYZING APPARATUS INCLUDING THE SAME, AND RELATED METHODS OF MANUFACTURING SEMICONDUCTOR DEVICES

CROSS-REFERENCE TO RELATED APPLICATION(S)

This application claims priority to and the benefit of Korean Patent Application No. 10-2022-0178427 filed in the Korean Intellectual Property Office on Dec. 19, 2022, the disclosure of which is incorporated herein by reference in its entirety.

BACKGROUND

1. Field

The disclosure relates to a jitter measuring circuit, a jitter analyzing apparatus including the same, and methods of manufacturing semiconductor devices related to the same.

2. Description of the Related Art

Noise characteristics of semiconductor circuits are important due to the increasing speed and process miniaturization of semiconductor devices. In particular, clock jitter (e.g., random jitter in a clock) among the noise characteristics may reduce the system performance of semiconductor devices. A noise measuring circuit may be provided, for example, on-chip or in a test element group (TEG).

There are techniques for measuring propagation delay using ring oscillators for noise measurement. However, due to the nature of ring oscillators, the jitter may be superimposed, and an additional circuit for measuring the propagation delay may be added, such that it may be not possible to measure the jitter at a single logic gate level. In addition, in conventional methods using delay circuits, the overall jitter of the delay circuit is converted into a digital signal, such that it may be difficult to de-embed the components of the jitter and measure the jitter at the single logic gate level. High-resolution time to digital converters (TDCs) may be used, but area constraints on the on-chip or TEG space may make them difficult to mount. Therefore, it is desired to analyze the jitter component of the single logic gate level such that noise characteristics of semiconductor circuits may be precisely predicted.

SUMMARY

Some embodiments may provide a jitter measuring circuit, a jitter analyzing apparatus including the same, and a jitter analyzing method.

According to some embodiments, a jitter analyzing apparatus may include a first delay circuit, a second delay circuit, and a test device. The first delay circuit may delay a reference clock to output a first clock. The second delay circuit may delay the reference clock to output a second clock and have a delay value greater than the first delay circuit. The test device may measure a jitter component of the first and second delay circuits by measuring the first clock and the second clock.

According to some embodiments, a jitter measuring circuit may include a first delay circuit, a second delay circuit, a first output driver, and a second output driver. The first delay circuit may include a plurality of first logic gates connected in series, and may output a first clock by delaying a reference clock through the plurality of first logic gates. The second delay circuit may include a plurality of second logic gates connected in series, and may output a second clock by delaying the reference clock through the plurality of second logic gates. The number of second logic gates may be greater than a number of first logic gates. The first output driver may output the first clock to a test device, and the second output driver may output the second clock to the test device. The jitter measuring circuit may measure a jitter component of the logic gate based on the first clock and the second clock.

According to some embodiments, a method of manufacturing a semiconductor device including a jitter analyzing apparatus may be provided. The method may include analyzing jitter by using the jitter analyzing apparatus, the analyzing jitter comprising: outputting a first clock by delaying a reference clock through a first number of logic gates, outputting a second clock by delaying the reference clock through a second number of logic gates, the second number being greater than the first number, calculating first measurement values by measuring a time at which an edge of the first clock becomes a predetermined level, calculating second measurement values by measuring a time at which an edge of the second clock becomes the predetermined level, and analyzing a jitter component of a single logic gate based on the first measurement values, the second measurement values, the first number, and the second number.

BRIEF DESCRIPTION OF THE DRAWINGS

FIG. 7 is a diagram illustrating an example of a distribution of measurement values of a clock output from a first delay circuit shown in FIG. 1 according to example embodiments.

FIG. 9 is a block diagram illustrating an example of a jitter analyzing apparatus according to some embodiments.

DETAILED DESCRIPTION OF THE EMBODIMENTS

Figure 1:
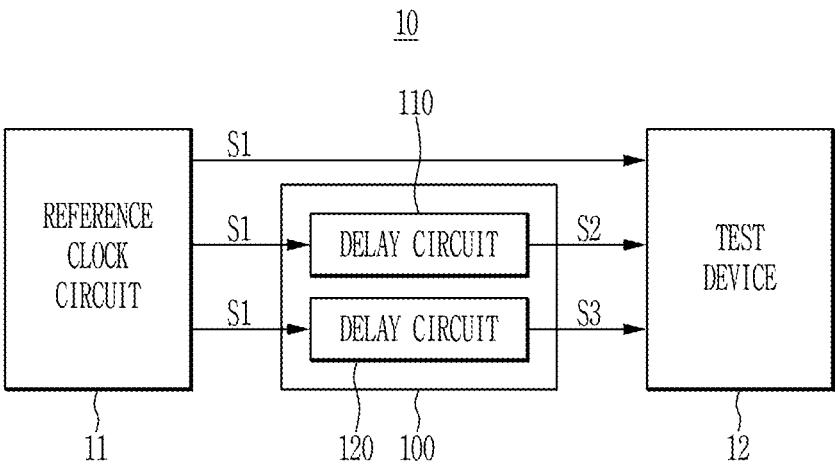
FIG. 1 is a block diagram illustrating an example of a jitter analyzing apparatus according to some embodiments.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

Figure 2:
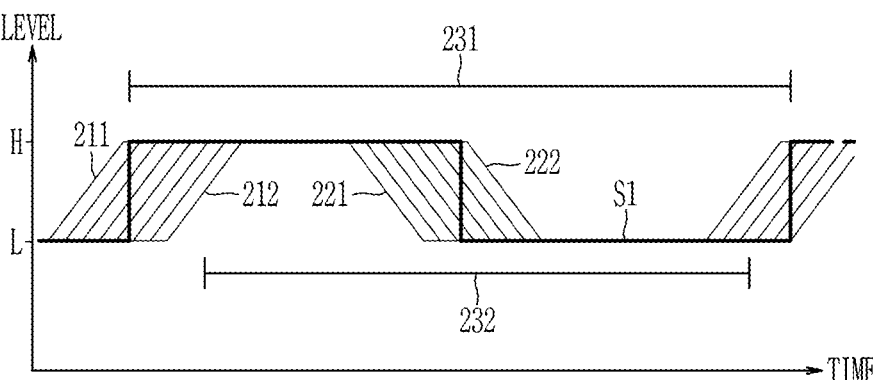
FIG. 2 is a diagram illustrating an example of a clock in which jitter occurs.
Figure 3:
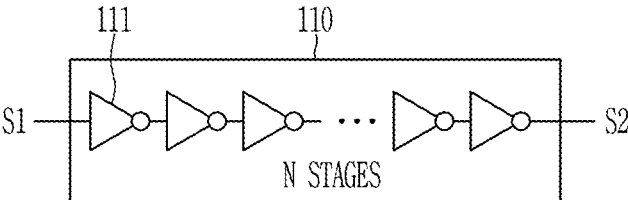
FIG. 3 is a circuit diagram illustrating an example of a first delay circuit shown in FIG. 1 according to example embodiments.
Figure 4:
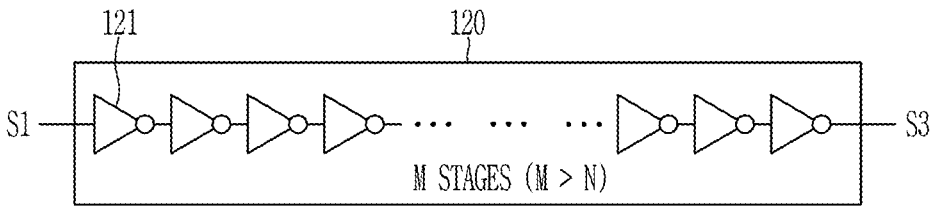
FIG. 4 is a circuit diagram illustrating an example of a second delay circuit shown in FIG. 1 according to example embodiments.
Figure 5:
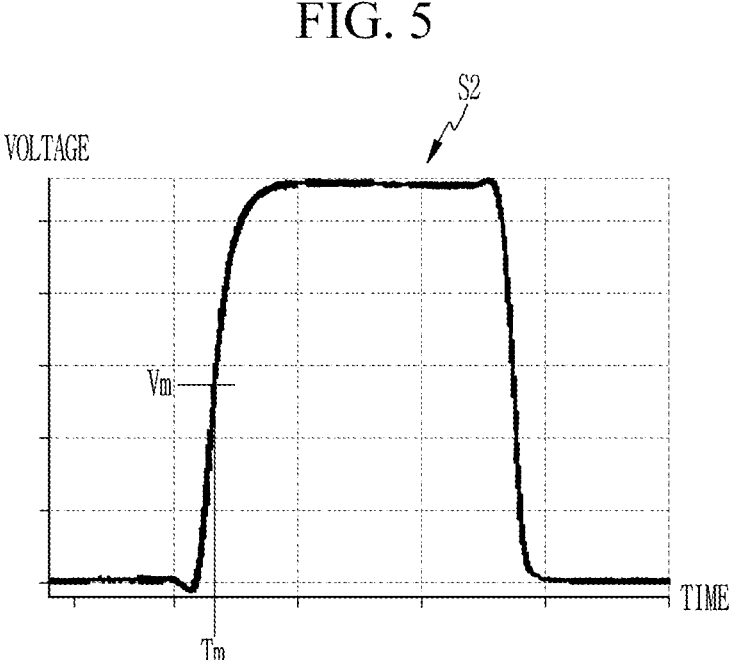
FIG. 5 is a diagram illustrating an example of a measurement of a clock output from a first delay circuit shown in FIG. 1 according to example embodiments.
Figure 6:
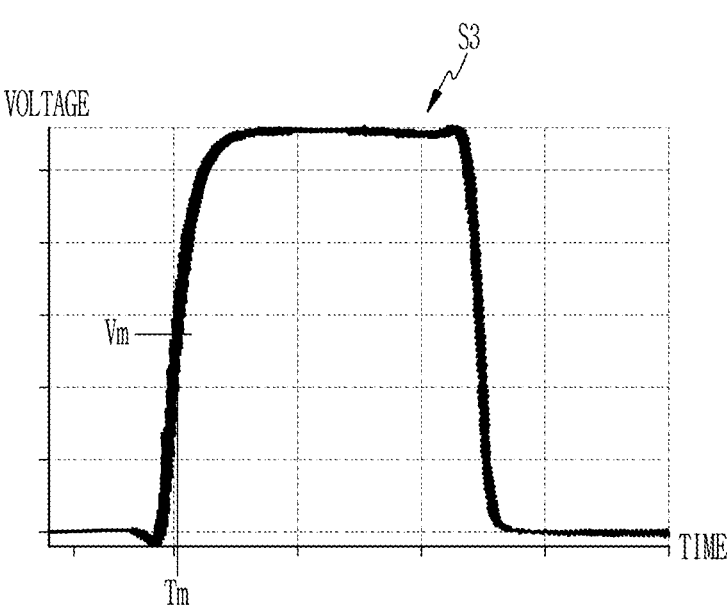
FIG. 6 is a diagram illustrating an example of a measurement of a clock output from a second delay circuit shown in FIG. 1 according to example embodiments.
Figure 7:
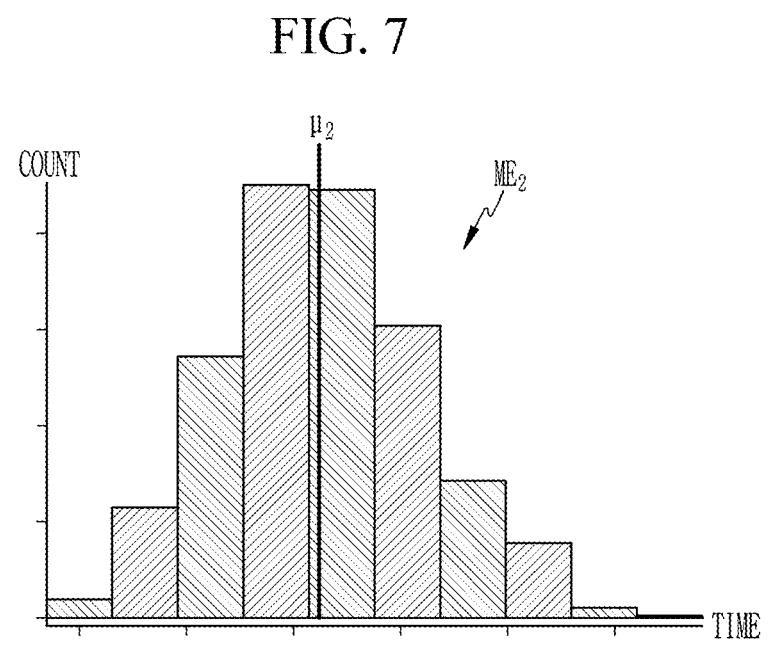
Figure 8:
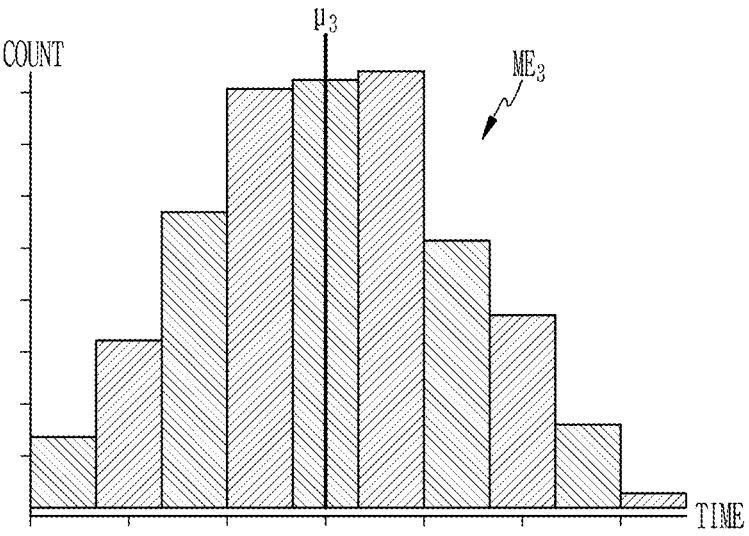
FIG. 8 is a diagram illustrating an example of a distribution of measurement values of a clock output from a second delay circuit shown in FIG. 1 according to example embodiments.

FIG. 1 is a block diagram illustrating an example of a jitter analyzing apparatus according to some embodiments, FIG. 2 is a diagram illustrating an example of a clock in which jitter occurs, FIG. 3 is a circuit diagram illustrating an example of a first delay circuit shown in FIG. 1 according to example embodiments, FIG. 4 is a circuit diagram illustrating an example of a second delay circuit shown in FIG. 1 according to example embodiments, FIG. 5 is a diagram illustrating an example of a measurement of a clock output from a first delay circuit shown in FIG. 1 according to example embodiments, FIG. 6 is a diagram illustrating an example of a measurement of a clock output from a second delay circuit shown in FIG. 1 according to example embodiments, FIG. 7 is a diagram illustrating an example of a distribution of measurement values of a clock output from a first delay circuit shown in FIG. 1 according to example embodiments, and FIG. 8 is a diagram illustrating an example of a distribution of measurement values of a clock output from a second delay circuit shown in FIG. 1 according to example embodiments.

Referring to FIG. 1, a jitter analyzing apparatus 10 may include a reference clock circuit 11, a jitter measuring circuit 100, and a test device 12. The jitter measuring circuit 100 may include delay circuits 110 and 120. In some embodiments, the jitter measuring circuit 100 may further include the reference clock circuit 11 and/or the test device 12.

The reference clock circuit 11 may provide a reference clock for a semiconductor device. In some embodiments, the reference clock circuit 11 may generate a reference clock S1 and then provide the reference clock S1. The reference clock circuit 11 may be, for example, a waveform generating circuit. As used herein, a semiconductor device may refer, for example, to a device such as a semiconductor chip formed and cut from a semiconductor wafer.

In some embodiments, the jitter analyzing apparatus 10 may be provided in a semiconductor chip (e.g., on-chip) formed on a semiconductor wafer. In this case, the semiconductor chip may include semiconductor circuits such as a transistor, a memory cell array, a row decoder, a column decoder, etc., for performing a normal operation (read or write operation) and test circuits such as the jitter analyzing apparatus 10 or the jitter measuring circuit 100. In some embodiments, the reference clock circuit 11 and the test device 12 may be provided at an outside of the semiconductor chip and the jitter measuring circuit 100 may be provided in a semiconductor chip (e.g., on-chip) formed on a semiconductor wafer. In some embodiments, the jitter measuring circuit 100 may be provided in TEG form. In this case, the TEG may be formed in a scribe lane adjacent to the semiconductor chips on the semiconductor wafer.

Referring to FIG. 2, the reference clock S1 may be provided to have a predetermined period 231. In FIG. 2, a horizontal axis represents time and a vertical axis represents a logic levels (or voltage level). The reference clock S1 may repeat a cycle 231 of rising from a logic level having a low level L to a logic level having a high level H, and then falling from the high level H to the low level L. However, a semiconductor circuit (or integrated circuit) included in a semiconductor device receiving the reference clock S1 may experience jitter due to various factors. The jitter may be a difference in signal between the reference clock S1 and a clock that actually occurs, and may manifest as distortion of the reference clock S1. The jitter may distort rising edges 211 and 212 and/or falling edges 221 and 222 of the reference clock S1, or may cause the reference clock S1 to arrive later or earlier than actual arrival time. For example, as shown in FIG. 2, the rising edge 211 or falling edge 221 may arrive earlier, or the rising edge 212 or falling edge 222 may arrive later. In addition, a period 232 of the reference clock S1 may be shorter or longer than the desired period 231 due to the distortion of the rising edge 211 or 212, and/or falling edge 221 or 222 in the reference clock S1.

The jitter may be random jitter caused by noise, and the random jitter may follow a normal distribution. The random jitter may vary due to a variety of factors. For example, the jitter may vary due to process-voltage-temperature (PVT) variations. Despite circuits which are identically designed and manufactured, the jitter may occur differently from die to die or may occur even in the same die (or chip), due to variations of a semiconductor manufacturing process. Furthermore, the jitter may vary due to a temperature of a semiconductor device including the semiconductor circuit and/or a voltage applied to the semiconductor device.

The delay circuit (or first delay circuit) 110 may delay the reference clock S1 input from the reference clock circuit 11 to output a delay clock S2, and the delay circuit (or second delay circuit) 120 may delay the reference clock S1 input from the reference clock circuit 11 to output a delay clock S3. The delay circuits 110 and 120 may have different delay values, and the delay value of the delay circuit 120 may be longer than the delay value of the delay circuit 110.

In some embodiments, the same logic gate 111 may be connected in a plurality of stages (e.g., N stages) to implement the delay circuit 110, as shown in FIG. 3, and the same logic gate 121 may be connected in a plurality of stages (e.g., M stages) to implement the delay circuit 120, as shown in FIG. 4. For example, the delay circuit 110 may include a plurality of logic gates (e.g., N logic gates) 111 connected in series, and the delay circuit 120 may also include a plurality of logic gates (e.g., M logic gates) 121 connected in series. The single logic gate 111 used to implement the delay circuit 110 and the single logic gate 121 used to implement the delay circuit 120 may be the same logic gate. In some embodiments, the two delay circuits 110 and 120 may be implemented with the same circuit configuration except for the number of stages. Each logic gate of the logic gates 111 and 121 may be, for example, an inverter, but are not limited thereto. In this case, the number of logic gates 121 (i.e., the number of stages) (e.g., M) of the delay circuit 120 may be greater than the number of logic gates 111 (i.e., the number of stages) (e.g., N) of the delay circuit 110.

The delay circuits 110 and 120 may be a device under test (DUT) of the test device 12. The test device 12 may measure a jitter component of the single logic gate 111 or 121 based on the delay clock S2 from the delay circuit 110 and the delay clock S3 from the delay circuit 120.

In some embodiments, because the jitter may follow the normal distribution, the test device 12 may measure a time of a predetermined point in the delay clock S2 in a plurality of cycles, as shown in FIG. 5, and a time of a predetermined point in the delay clock S3 in a plurality of cycles, as shown in FIG. 6. In FIGS. 5 and 6, a horizontal axis represents time (e.g., ps) and a vertical axis represents a voltage level (e.g., mV). The time difference between two adjacent scales on the horizontal axis in FIG. 5 may be the same as the time difference between two adjacent scales on the horizontal axis in FIG. 6, and the voltage difference between two adjacent scales on the vertical axis in FIG. 5 may be the same as the voltage difference between two adjacent scales on the vertical axis in FIG. 6. In some embodiments, the predetermined point may be a point at which a level of the delay clock S2 or S3 becomes a predetermined level Vm on a rising edge, or a point at which the level of the delay clock S2 or S3 becomes the predetermined level on a falling edge. In examples shown in FIGS. 5 and 6, the predetermined point may be a point at which the level of the delay clock S2 or S3 becomes the predetermined level Vm, which is an intermediate level of the high level, on the rising edge. Thus, the test device 12 may measure, as measurement values, the time Tm at which the delay clocks S2 and S3 become the predetermined level Vm on the rising edge in the plurality of cycles.

The test device 12 may calculate a mean $\mu_2$ of measurement values $ME_2$ (e.g., times Tm at which the delay clock S2 becomes the predetermined level Vm) in the plurality of cycles of the delay clock S2 as shown in FIG. 7, and may calculate a standard deviation $\sigma_2$ of the measurement values $ME_2$ based on the mean $\mu_2$ and the measurement values $ME_2$. Similarly, the test device 12 may calculate a mean $\mu_3$ of measurement values $ME_3$ (e.g., times Tm at which the delay clock S3 becomes the predetermined level Vm) in the plurality of cycles of the delay clock S3 as shown in FIG. 8, and calculate a standard deviation $\sigma_3$ of the measurement values $ME_3$ based on the mean $\mu_3$ and the measurement values $ME_3$. In FIGS. 7 and 8, the horizontal axis represents time (e.g., ps) and the vertical axis represents a count of measurement samples (i.e., the number of measurement samples). The time difference between two adjacent scales on the horizontal axis of FIG. 8 may be the same as twice the time difference between two adjacent scales on the horizontal axis of FIG. 7. For example, a time range between the earliest group and the latest group on the horizontal axis of FIG. 8 may be twice a time range between the earliest group and the latest group on the horizontal axis of FIG. 7. The count difference between two adjacent scales on the vertical axis of FIG. 7 may be the same as 2.5 times the count difference between two adjacent scales on the vertical axis of FIG. 8.

As shown in FIGS. 5 to 8, since the delay value of the delay circuit 120 is greater than the delay value of the delay circuit 110, a distribution width of the rising or falling edge of the delay clock S3 in the plurality of cycles may be wider than a distribution width of the rising or falling edge of the delay clock S2 in the plurality of cycles. In FIGS. 5 and 6, for convenience, samples with the earliest and latest edges are shown, and samples therebetween are colored black. Since the measurements in FIGS. 5 to 8 are for measurements of the standard deviations, a start time of the rising edge of the delay clock S2 and a start time of the rising edge of the delay clock S3 may be not relevant to the measurements of the standard deviations and may be set to arbitrary points in time. Referring to the distributions shown in FIGS. 5 to 8, it can be seen that the standard deviation $\sigma_2$ of the measurement values $ME_2$ in the delay clock S2 is less than the standard deviation $\sigma_2$ of the measurement values $ME_3$ in the delay clock S3.

By comparing the standard deviation $\sigma_2$ of the measurement values $ME_2$ in the delay clock S2 with the standard deviation $\sigma_3$ of the measurement values $ME_3$ in the delay clock S3, the test device 12 may calculate the jitter component of the single logic gate included in the delay circuits 110 and 120. The jitter component of the single logic gate 111 or 121 may be the standard deviation of the jitter occurring in the single logic gate 111 or 121.

The standard deviation arising from a series of components that follow an independent normal distribution may correspond to a square root of a sum of the squares of the standard deviations of the respective components. Thus, in the circuit shown in FIG. 1, the standard deviation $\sigma_2$ of the measurement value $ME_2$ in the delay clock S2 received by the test device 12 may be given as in Equation 1, and the standard deviation $\sigma_3$ of the measurement values $ME_3$ in the delay clock S3 received by the test device 12 may be given as in Equation 2.

$$\sigma_2 = \sqrt{\sigma_1^2 + \sigma_{E1}^2 + N \cdot \sigma_J^2 + \sigma_{E2}^2} \qquad \text{Equation 1}$$

$$\sigma_3 = \sqrt{\sigma_1^2 + \sigma_{E1}^2 + M \cdot \sigma_J^2 + \sigma_{E2}^2} \qquad \text{Equation 2}$$

In Equations 1 and 2, $\sigma_1$ is a standard deviation due to jitter occurring in the reference clock circuit 11, $$\sigma_{E1}^2$$

is a standard deviation due to jitter occurring in variable circuits (e.g., metal transmission lines and/or internal/external circuits) between the reference clock circuit 11 and the delay circuits 110 and 120, $\sigma_1$ is a standard deviation due to jitter occurring in the single logic gate 111 or 121, and $$\sigma_{E2}^2$$

is a standard deviation due to jitter occurring in variable circuits (e.g., metal transmission lines and/or internal/external circuits) between the delay circuits 110 and 120 and the test device 12. Further, N is the number of stages in the delay circuit 110 and M is the number of stages in the delay circuit 120.

Therefore, the test device 12 may calculate the jitter component $\sigma_1$ of the single logic gate 111 or 121 based on Equations 1 and 2, as in Equation 3.

$$\sigma_I = \sqrt{\frac{\sigma_3^2 - \sigma_2^2}{M - N}}$$

Equation 3

In some embodiments, the number of stages N of the delay circuit 110 and the number of stages M of the delay circuit 120 may be set to a sufficiently large value so that the jitter component in the delay clocks S2 and S3 may be measured. For example, N and M may be set to 100 and 200, respectively.

In some embodiments, the test device 12 may include an oscilloscope for measuring the delay clocks S2 and S3 and an arithmetic circuit (e.g., a processor) for computing the standard deviation.

In some embodiments, the test device 12 may analyze the jitter component of the external circuit based on the reference clock S1 from the reference clock circuit 11, the delay clock S2 from the delay circuit 110, and the delay clock S3 from the delay circuit 120.

According to the above-described embodiments, the test device may de-embed the jitter components of the reference clock circuit 11 and the external circuits from the jitter component of the received clock, and measure the jitter component of the single logic gate.

Figure 9:
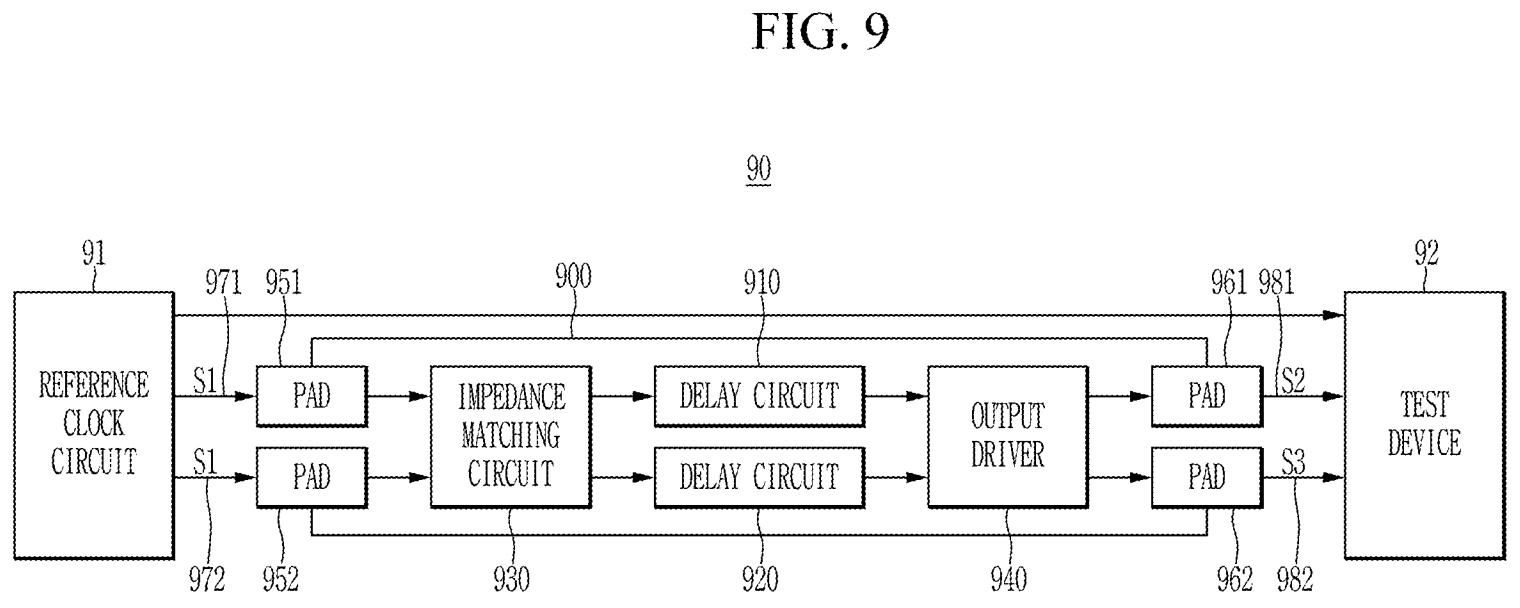
Figure 10:
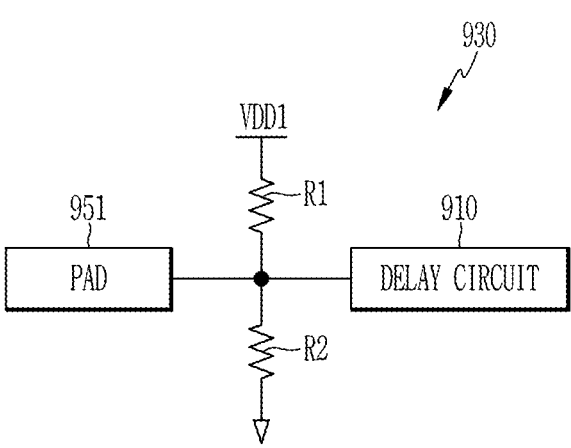
FIG. 10 is a circuit diagram illustrating an example of an impedance matching circuit shown in FIG. 9 according to example embodiments.
Figure 11:
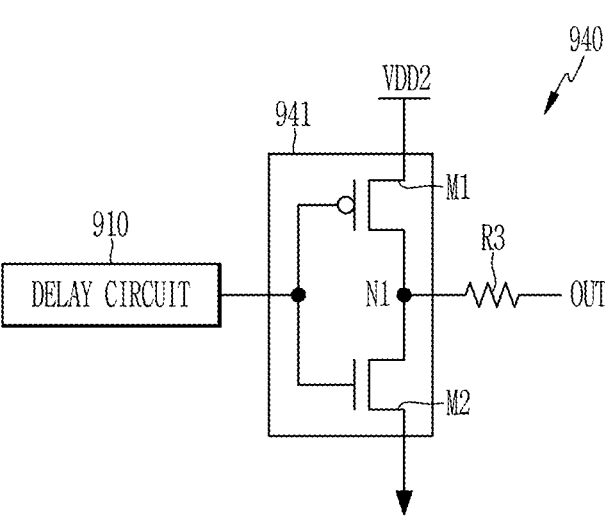
FIG. 11 and FIG. 12 each is a circuit diagram illustrating an example of an output driver shown in FIG. 9 according to example embodiments.
Figure 12:
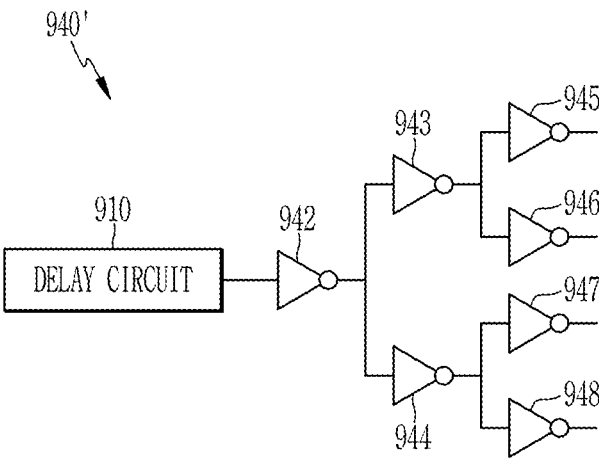

FIG. 9 is a block diagram illustrating an example of a jitter analyzing apparatus according to some embodiments, FIG. 10 is a circuit diagram illustrating an example of an impedance matching circuit shown in FIG. 9 according to example embodiments, and FIGS. 11 and 12 each is a circuit diagram illustrating an example of an output driver shown in FIG. 9 according to example embodiments.

Referring to FIG. 9, a jitter analyzing apparatus 90 may include a reference clock circuit 91, a jitter measuring circuit 900, and a test device 92. The jitter measuring circuit 900 may include delay circuits 910 and 920, an impedance matching circuit 930, and an output driver 940.

In some embodiments, the jitter analyzing apparatus 90 may be provided in a semiconductor chip (e.g., on-chip) formed on a semiconductor wafer. In this case, the semiconductor chip may include semiconductor circuits configured to perform a normal operation (read or write operation) and test circuits such as the jitter analyzing apparatus 90 or the jitter measuring circuit 900. The semiconductor circuits may include a transistor, a delay circuit, a memory cell array, a row decoder, a column decoder, a control circuit, etc. The semiconductor circuits and the test circuits included in the semiconductor chip may be formed by semiconductor manufacturing processes and the test circuits may be formed for modifying a noise model of the semiconductor circuits. For example, simulation parameters for transistors of the semiconductor circuits or semiconductor manufacturing processes forming the semiconductor circuits may be adjusted by modifying the noise model of the semiconductor circuits, for example, a transistor based on the jitter component of the single logic gate.

As described with reference to FIGS. 1 to 8, the delay circuit 910 may output a delay clock S2 by delaying a reference clock S1 input from the reference clock circuit 91, and the delay circuit 920 may output a delay clock S3 by delaying the reference clock S1 input from the reference clock circuit 91. The delay circuits 910 and 920 may have different delay values, and the delay value of the delay circuit 920 may be longer than the delay value of the delay circuit 910.

The impedance matching circuit 930 may perform input impedance matching of the jitter measuring circuit 900, i.e., impedance matching in transmission lines 971 and 972 between the reference clock circuit 91 and the jitter measuring circuit 900. In some embodiments, the jitter measuring circuit 900 may further include input pads 951 and 952 to which the transmission lines 971 and 972 of the reference clock circuit 91 are connected, respectively. In some embodiments, the jitter measuring circuit 900 may be provided in on-chip or TEG form. For example, the TEG may be formed in a scribe lane adjacent to semiconductor chips on the semiconductor wafer. In this case, the reference clock circuit 91 and the test device 92 may be provided at an outside of the semiconductor chip formed on a semiconductor wafer. The input pads 951 and 952 may be, for example, contact pads or bond pads for connecting the transmission lines 971 and 972 of the reference clock circuit 91 to the jitter measuring circuit 900. The input pads 951 and 952 may receive the reference clock S1 through the transmission lines 971 and 972 from the reference clock circuit 91 and transfer the reference clock S1 to the delay circuits 910 and 920, respectively.

The impedance matching circuits 930 may be provided for the input pads 951 and 952 (or delay circuits 910 and 920), respectively. The impedance matching circuit 930 provided for the input pad 951 (or delay circuit 910) may be referred to as a "first impedance matching circuit," and the impedance matching circuit 930 provided for the input pad 952 (or delay circuit 920) may be referred to as a "second impedance matching circuit." In some embodiments, as shown in FIG. 10, the impedance matching circuit 930 may be implemented as, for example, a center-tab termination structure, but is not limited thereto. For example, the impedance matching circuit (or first impedance matching circuit) 930 may include a termination resistor R1 connected between a power source VDD1 and the input pad 951 and a termination resistor R2 connected between the input pad 951 and a ground terminal. The termination resistors R1 and R2 may have the same resistance (e.g., 100Ω). The reference clock S1 may be transferred to the delay circuit 910 through a common node connected to the two termination resistors R1 and R2. Then, the transmission line 971 of the reference clock circuit 91 may be terminated at half of a supply voltage VDD1 by a voltage divided by a termination resistor formed in the reference clock circuit 91 and the termination resistor R1 or R2 of the impedance matching circuit 930. Accordingly, for example, a 50Ω termination may be provided. The impedance matching circuit (or second impedance matching circuit) 930, which is connected between the input pad 952 and the delay circuit 920, may also be implement with the same structure as the first impedance matching circuit 930.

The output driver 940 may output the delay clock S2 delayed by the delay circuit 910 and the delay clock S3 delayed by the delay circuit 920 to the test device 92. The output driver 940 may be an interface between the delay circuits 910 and 920 and the test device 92.

In some embodiments, the output driver 940 may perform output impedance matching, i.e., impedance matching in transmission lines 981 and 982 between the jitter measuring circuit 900 and the test device 92. In some embodiments, the jitter measuring circuit 900 may further include output pads 961 and 962 to which the transmission lines 981 and 982 for the test device 92 are connected, respectively. The output pads 961 and 962 may be, for example, contact pads or bond pads for connecting the transmission lines 981 and 982 to the jitter measuring circuit 900. The output pads 961 and 962 may receive the delay clocks S2 and S3, respectively, from the output driver 940, and may transfer the delay clocks S2 and S3 to the test device 92 through the transmission lines 981 and 982.

The output drivers 940 may be provided for the output pads 961 and 962 (or delay circuits 910 and 920), respectively. The output driver provided for the output pad 961 (or delay circuit 910) may be referred to as a "first output driver," and the output driver provided for the output pad 962 (or delay circuit 920) may be referred to as a "second output driver." In some embodiments, as shown in FIG. 11, the output driver (or first output driver) 940 may be implemented, for example, as a voltage mode driver (i.e., a source-series terminated (SST) driver) 941, with a series termination resistor R3 formed at an output node for the impedance matching, but is not limited thereto. The output driver 941 may be, for example, an inverter. The inverter may include a p-channel transistor (e.g., a p-channel metal oxide semiconductor (PMOS) transistor) M1 connected between a power source VDD2 and a node N1, and an n-channel transistor (e.g., an n-channel metal oxide semiconductor (NMOS) transistor) M2 connected between the node N1 and a ground terminal. Gates of the transistors M1 and M2 may be connected to an output of the delay circuit 910, and the termination resistor R3 may be connected between the node N1 and the output OUT of the output driver 940. The output OUT of the output driver 940 may be connected to the output pad 961. In this case, turn-on resistors of the transistors M1 and M2 may be set to the same size as the termination resistor R3 (e.g., 25Ω). Then, the transistor M1 or M2 may be turned on depending on a level of the delay clock S2 transferred from the delay circuit 910. Accordingly, for example, a 50Ω termination may be provided. The output driver (or second output driver) 940, which is connected between the delay circuit 920 and the output pad 962, may also be implemented with the same structure as the first output driver.

In some embodiments, an output driver 940' may include a plurality of drivers connected in a multi-stage. In some embodiments, each driver may be, for example, an inverter. For example, as shown in FIG. 12, the output driver (or first output driver) 940' may have an inverter 942 having the output of the delay circuit 910 as an input, two inverters 943 and 944 having the output of the inverter 942 as inputs, and four inverters 945, 946, 947, and 948 having the outputs of the inverters 943 and 944 as inputs. In this case, the output of the inverter 943 may be input to the inverters 945 and 946, and the output of the inverter 944 may be input to the inverters 947 and 948. The output driver 940' may combine the outputs of the inverters 945 to 948 and transfer the combined outputs to the output pad 961. Accordingly, a current of the delay clock S2 transferred to the output pad 961 may increase. The output driver (or second output driver) 940', which is connected between the delay circuit 920 and the output pad 962, may also be implemented with the same structure as the first output driver.

As described above, by using the impedance matching circuit 930 and the output driver 940, the impedance matching for the jitter measurement of the clock having the high frequency may be performed.

Figure 13:
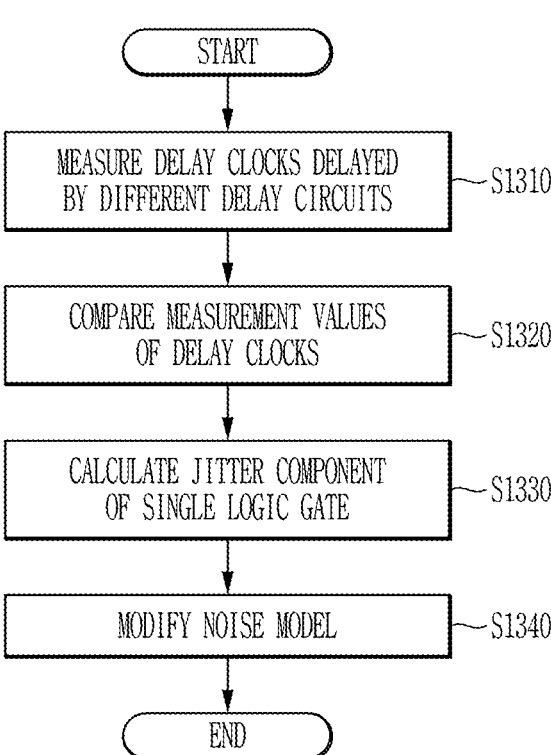
FIG. 13 and FIG. 14 each is a flowchart illustrating an example of a jitter analyzing method according to some embodiments.

FIG. 13 is a flowchart illustrating an example of a jitter analyzing method according to some embodiments.

Referring to FIG. 13, a test device (e.g., 92 in FIG. 9) of a jitter analyzing apparatus may measure two delay clocks (e.g., S2 and S3 in FIG. 9) transferred from two delay circuits (e.g., 910 and 920 in FIG. 9) having different delay values in S1310. In some embodiments, the test device 92 may measure, as measurement values, times at which rising edges or falling edges of the delay clock S2 reach a predetermined level, and may measure a standard deviation of the measurement values of the delay clock S2. Further, the test device 92 may measure, as measurement values, times at which rising edges or falling edges of the delay clock S3 reach the predetermined level, and may measure a standard deviation of the measurement values of the delay clock S3.

The test device 92 may compare the measurement values of the delay clock S2 with the measurement values of the delay clock S3 in S1320. In some embodiments, the test device 92 may calculate a difference between a square of the standard deviation of the measurement values in the delay clock S2 and a square of the standard deviation of the measurement values in the delay clock S3. The test device 92 may calculate a jitter component of a single logic gate based on a comparison result of the measurement values of the delay clock S2 and the measurement values of the delay clock S3, and a difference in the number of stages in the two delay circuits 910 and 920 in S1330. In some embodiments, the test device 92 may calculate a square root of a value obtained by dividing the difference between the square of the standard deviation of the measurement values in the delay clock S2 and the square of the standard deviation of the measurement value in the delay clock S3 by the difference in the number of stages of the two delay circuits 910 and 920 as the jitter component of the single logic gate.

In some embodiments, the jitter analyzing apparatus 90 may modify a noise model of a semiconductor circuit (e.g., a transistor) using the jitter component of the single logic gate in S1340. The jitter analyzing apparatus 90 may quantify noise characteristics of the single logic gate based on the jitter component of the single logic gate by the test device 92, and may modify the noise model of the semiconductor circuit based on the quantified noise characteristics. Further, the jitter analyzing apparatus 90 may more precisely predict a margin of noise characteristics of the semiconductor circuit according to increase in the number of logic gates. A result from the jitter analyzing according to example embodiments herein described may be used for adjusting simulation parameters for transistors included in the semiconductor circuits and/or manufacturing processes forming semiconductor devices such that the system performance of the semiconductor devices may increase. A method of manufacturing semiconductor devices according to example embodiments will be discussed in detail below with reference to FIG. 15.

Figure 14:
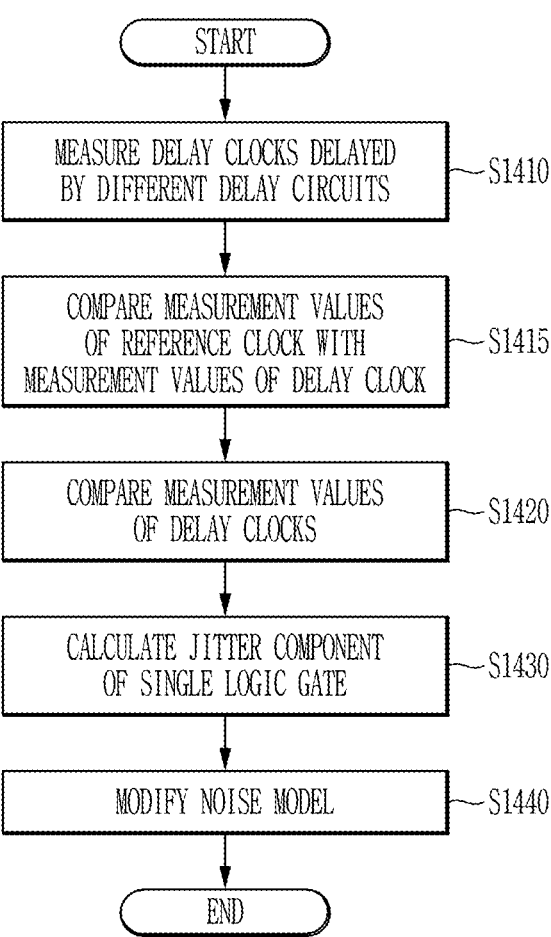

FIG. 14 is a flow diagram illustrating an example of a jitter analyzing method according to some embodiments.

Referring to FIG. 14, a test device (e.g., 92 of FIG. 9) of a jitter analyzing apparatus may measure a clock (e.g., S1 of FIG. 9) transferred from a reference clock circuit (e.g., 91 of FIG. 9) and two delay clocks (e.g., S2 and S3 of FIG. 9) transferred from two delay circuits (e.g., 910 and 920 of FIG. 9) having different delay values in S1410. In some embodiments, the test device 92 may measure, as measurement values, times when rising edges or falling edges of the reference clock S1 reach a predetermined level, and may measure a standard deviation of the measurement values of the reference clock S1. Similarly, as described with reference to FIGS. 1 to 12, the test device 92 may measure a standard deviation of measurement values in each of the delay clocks S2 and S3.

The test device 92 may compare the measurement values of the reference clock S1 with the measurement values of the delay clock S2 and/or the delay clock S3 in S1415. In some embodiments, the test device 92 may compare the standard deviation of the measurement values in the reference clock S1 with the standard deviation of the measurement value in the delay clock S2. As described with reference to Equation 1, the standard deviation of the measurement values in the delay clock S2 may be given as a square root of a sum of a square of a standard deviation due to jitter occurring in the reference clock circuit (e.g., 91 in FIG. 9) (i.e., the standard deviation due to jitter in the reference clock S1), a square of a standard deviation due to jitter occurring in an external circuit (e.g., an input pad 951 and an impedance matching circuit 930 in FIG. 9), a square of a standard deviation due to jitter occurring in the delay circuit 910, and a square of a standard deviation due to jitter occurring in another circuit (e.g., an output driver 940 and an output pad 961 in FIG. 9). Thus, by comparing the standard deviation of the measurement values of the reference clock S1 with the standard deviation of the measurement values of the delay clock S2, the test device 92 may determine whether the measurement values (e.g., the measurement values of the clock S2) of the remaining components (e.g., components occurring in the input pad 951, the impedance matching circuit 930, the delay circuit 910, the output driver 940, and the output pad 961) other than the reference clock S1 are significant. Similarly, by comparing the standard deviation of the measurement values of the reference clock S1 with the standard deviation of the measurement values of the delay clock S3, the test device 92 may determine whether the measurement values (e.g., the measurement values of the clock S3) of the remaining components (e.g., components occurring in an input pad (e.g., 952 in FIG. 9), an impedance matching circuit 930, the delay circuit 920, the output driver 940, and an output pad (e.g., 962 in FIG. 9)) other than the reference clock S1 are significant. In some embodiments, if the difference between the standard deviation of the measurement values of the reference clock S1 and the standard deviation of the measurement values of the delay clock S2 or the standard deviation of the measurement values of the delay clock S3 is less than a reference value, the test device 92 may determine that the measurement values of the remaining components are not significant. In some embodiments, if the measurement values of the remaining component are not significant, the test device 92 may measure the jitter of the delay clock S2 and/or the delay clock S3 again. For example, the test device 92 may measure the jitter of the delay clock S2 and/or the delay clock S3 after reducing the jitter of the reference clock circuit 91.

As described with reference to FIG. 13, the test device 92 may compare the measurement values of the delay clock S2 with the measurement values of the delay clock S3 in S1420, and may analyze a jitter component of a single logic gate based on a comparison result of the measurement values of the delay clock S2 and the measurement values of the delay clock S3, and a difference in the number of stages in the two delay circuits 910 and 920 in S1430. In some embodiments, the jitter analyzing apparatus 90 may modify a noise model of the semiconductor circuits, for example, a transistor based on the jitter component of the single logic gate in S1440.

Figure 15:
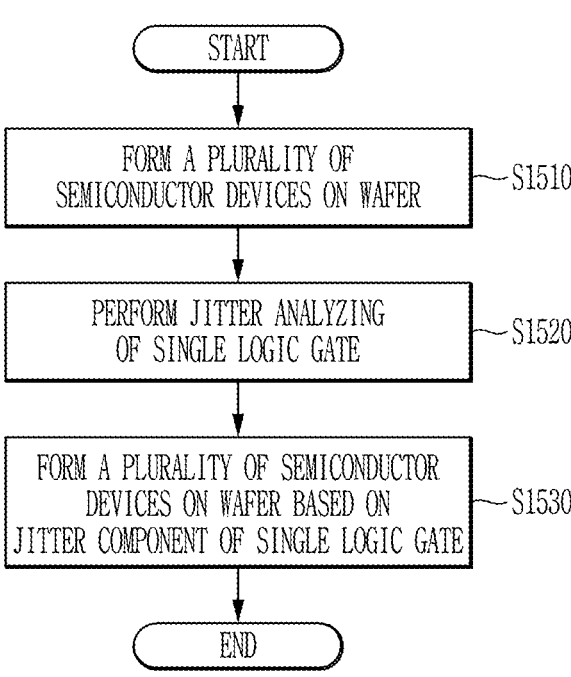
FIG. 15 is a flowchart illustrating a method of manufacturing semiconductor devices using the method of testing the semiconductor devices according to example embodiments.

FIG. 15 is a flowchart illustrating a method of manufacturing semiconductor devices using the method of testing the semiconductor devices according to example embodiments.

First, a plurality of semiconductor devices may be formed on a semiconductor wafer in S1510. Each of the plurality of semiconductor devices may include a plurality of semiconductor circuits and one or more test circuits. The plurality of semiconductor devices may be substantially the same. For example, the plurality of semiconductor devices may be a same type of device.

Next, the one or more test circuits may be provided to analyze jitter component of a logic gate in S1520. The one or more test circuits may be tested according to the jitter analyzing methods described herein. Subsequently, the semiconductor devices may be formed based on the jitter component of the single logic gate in S1530. For example, the plurality of semiconductor devices may be formed on the semiconductor wafer using the modified noise model of the semiconductor circuits (e.g., a transistor) such that the system performance of the semiconductor devices may increase.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A jitter analyzing apparatus comprising:
   a first delay circuit configured to delay a reference clock to output a first clock;
   a second delay circuit configured to delay the reference clock to output a second clock and have a delay value greater than the first delay circuit; and
   a test device configured to measure a jitter component of the first and second delay circuits by measuring the first clock and the second clock.

2. The jitter analyzing apparatus of claim 1, wherein the first delay circuit comprises a plurality of first stages and a number of the plurality of first stages is a first number,
   wherein the second delay circuit comprises a plurality of second stages and a number of the plurality of second stages is a second number being greater than the first number, and
   wherein each of the plurality of first stages and the plurality of second stages includes a logic gate.

3. The jitter analyzing apparatus of claim 2, wherein the jitter component includes a jitter component of the logic gate.

4. The jitter analyzing apparatus of claim 3, wherein the test device is further configured to:
   calculate first measurement values by measuring a time at which an edge of the first clock becomes a predetermined level,
   calculate second measurement values by measuring a time at which an edge of the second clock becomes the predetermined level, and
   measure the jitter component based on a comparison result of the first measurement values and the second measurement values, and a difference between the second number and the first number.

5. The jitter analyzing apparatus of claim 4, wherein the test device is further configured to measure, as the jitter component, a square root of a value obtained by dividing a difference between a square of a standard deviation of the second measurement values and a square of a standard deviation of the first measurement values by the difference between the second number and the first number.

6. The jitter analyzing apparatus of claim 4, wherein the test device is further configured to:
   calculate third measurement values by measuring a time at which an edge of the reference clock becomes the predetermined level, and
   determine whether the first measurement values and the second measurement values are significant, based on a comparison result of the first measurement values and the third measurement values and/or a comparison result of the second measurement values and the third measurement values.

7. The jitter analyzing apparatus of claim 6, wherein the test device is further configured to determine whether the first measurement values and the second measurement values are significant, based on a difference between a standard deviation of the first measurement values and a standard deviation of the third measurement values and/or a difference between the standard deviation of the second measurement values and a standard deviation of the third measurement values.

8. The jitter analyzing apparatus of claim 3, wherein the jitter analyzing apparatus is configured to modify a noise model of a transistor included in the first and second delay circuits based on the jitter component.

9. The jitter analyzing apparatus of claim 1, further comprising:
an impedance matching circuit configured to perform impedance matching in transmission lines configured to transfer the reference clock to the first delay circuit and the second delay circuit; and
an output driver configured to transfer the first clock output from the first delay circuit and the second clock output from the second delay circuit to the test device, and perform impedance matching in transmission lines configured to transfer the first clock and the second clock.

10. The jitter analyzing apparatus of claim 9, wherein the output driver comprises a plurality of drivers connected in a multi-stage.

11. A jitter measuring circuit comprising:
a first delay circuit comprising a plurality of first logic gates connected in series, and configured to output a first clock by delaying a reference clock through the plurality of first logic gates;
a second delay circuit comprising a plurality of second logic gates connected in series, and configured to output a second clock by delaying the reference clock through the plurality of second logic gates, a number of second logic gates being greater than a number of first logic gates;
a first output driver configured to output the first clock to a test device; and
a second output driver configured to output the second clock to the test device,
wherein the jitter measuring circuit is configured to measure a jitter component of a single logic gate of the plurality of first and second logic gates based on the first clock and the second clock.

12. The jitter measuring circuit of claim 11, wherein each of the plurality of first logic gates and each of the plurality of second logic gates are the same logic gate.

13. The jitter measuring circuit of claim 11, further comprising:
a first input pad connected to a first transmission line configured to transfer the reference clock;
a second input pad connected to a second transmission line configured to transfer the reference clock;
a first output pad connected to a third transmission line configured to transfer the first clock output from the first output driver to the test device; and a second output pad connected to a fourth transmission line configured to transfer the second clock output from the second output driver to the test device.

14. The jitter measuring circuit of claim 13, further comprising:
a first impedance matching circuit connected between the first input pad and the first delay circuit, and configured to perform impedance matching in the first transmission line; and
a second impedance matching circuit connected between the second input pad and the second delay circuit, and configured to perform impedance matching in the second transmission line.

15. The jitter measuring circuit of claim 14, wherein each of the first impedance matching circuit and the second impedance matching circuit includes a center-tap termination structure.

16. The jitter measuring circuit of claim 13, wherein each of the first output driver and the second output driver comprises a plurality of drivers connected in multi-stage.

17. The jitter measuring circuit of claim 13, wherein the first output driver is further configured to perform impedance matching in the third transmission line, and
wherein the second output driver is further configured to perform impedance matching in the fourth transmission line.

18. A method of manufacturing a semiconductor device including a jitter analyzing apparatus, the method comprising:
analyzing jitter by using the jitter analyzing apparatus, the analyzing jitter comprising:
outputting a first clock by delaying a reference clock through a first number of logic gates;
outputting a second clock by delaying the reference clock through a second number of logic gates, the second number being greater than the first number;
calculating first measurement values by measuring a time at which an edge of the first clock becomes a predetermined level;
calculating second measurement values by measuring a time at which an edge of the second clock becomes the predetermined level; and
analyzing a jitter component of a single logic gate of the first and second numbers of logic gates based on the first measurement values, the second measurement values, the first number, and the second number; and
forming the semiconductor device based on the jitter component of the single logic gate.

19. The manufacturing method of claim 18, wherein the analyzing of the jitter component includes analyzing the jitter component of the single logic gate based on a difference between a square of a standard deviation of the second measurement values and a square of a standard deviation of the first measurement values, and a difference between the second number and the first number.

20. The manufacturing method of claim 18,
wherein the forming the semiconductor device comprises forming the semiconductor device by modifying a noise model of a transistor included in the semiconductor device based on the jitter component of the single logic gate.

* * * * *